(12) United States Patent
Sugimoto

(10) Patent No.: US 7,764,099 B2
(45) Date of Patent: Jul. 27, 2010

(54) SEMICONDUCTOR INTEGRATED CIRCUIT DEVICE

(75) Inventor: Kei Sugimoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/806,027

(22) Filed: May 29, 2007

(65) Prior Publication Data

US 2007/0296474 A1    Dec. 27, 2007

(30) Foreign Application Priority Data

May 30, 2006 (JP) ............... 2006-149904

(51) Int. Cl.
H03K 3/02 (2006.01)

(52) U.S. Cl. .................. 327/198; 327/217; 327/156

(58) Field of Classification Search .................. 327/142, 327/143, 198, 217, 147–150, 156–159
See application file for complete search history.

(56) References Cited

U.S. PATENT DOCUMENTS

| 5,369,310 | A  | * | 11/1994 | Badyal et al. ............... 327/143 |
| 6,333,659 | B1 |   | 12/2001 | Saeki |
| 6,388,493 | B2 |   | 5/2002  | Saeki |
| 6,396,320 | B2 |   | 5/2002  | Saeki |
| 6,501,316 | B2 |   | 12/2002 | Saeki |
| 6,504,414 | B2 |   | 1/2003  | Saeki |
| 6,535,989 | B1 |   | 3/2003  | Dvorak et al. |
| 6,600,354 | B2 |   | 7/2003  | Saeki |
| 6,937,680 | B2 | * | 8/2005  | Fong et al. ............... 375/357 |
| 7,170,333 | B2 |   | 1/2007  | Saeki |
| 7,239,190 | B2 |   | 7/2007  | Saeki |
| 2006/0055443 | A1 | * | 3/2006 | Suzuki ............... 327/295 |
| 2007/0097562 | A1 |   | 5/2007 | Shinoda |

FOREIGN PATENT DOCUMENTS

| JP | 08-130464    |   | 5/1996  |
| JP | 8-263177     | A | 10/1996 |
| JP | 11-355262    |   | 12/1999 |
| JP | 2000-124779  | A | 4/2000  |
| JP | 2001-236133  | A | 8/2001  |
| JP | 2003-122593  | A | 4/2003  |
| JP | 2003-152515  | A | 5/2003  |
| JP | 2005-039808  | A | 2/2005  |

* cited by examiner

*Primary Examiner*—Long Nguyen
*Assistant Examiner*—Sibin Chen
(74) *Attorney, Agent, or Firm*—Foley & Lardner LLP (57) ABSTRACT

DLL circuit operating more stably at reset. Voltage comparator circuit 21 outputs comparison result signal to hold circuit 22 at first level when power supply voltage VAA is not higher than reference voltage REF and at second level when power supply voltage VAA exceeds reference voltage REF. Hold circuit 22 outputs reset signal RST that it has received to DLL circuit 23 as it is when comparison result signal indicates first level and at second level, hold circuit 22 holds reset signal RST until comparison result signal becomes first level and then outputs it to DLL circuit 23.

7 Claims, 9 Drawing Sheets

SEMICONDUCTOR INTEGRATED CIRCUIT DEVICE

REFERENCE TO RELATED APPLICATIONS

The present application is claiming the priority of the earlier Japanese patent application No. 2006-149904 filed on May 30, 2006, the entire disclosure thereof being incorporated herein by reference thereto.

FIELD OF THE INVENTION

The present invention relates to a semiconductor integrated circuit device, and particularly to a semiconductor integrated circuit device comprising a DLL (Delay Locked Loop) circuit or a PLL (Phase Locked Loop) circuit.

BACKGROUND OF THE INVENTION

In recent years, with increased operation speed of semiconductor devices, it has become common to have a DLL circuit or PLL circuit in such a device as means of synchronizing the input/output timing of data to a system clock signal. For example, in DDR2-DRAM (Double Data Rate 2-Dynamic Random Access Memory), the DLL circuit initializes the internal circuitry with a DLL reset signal when the power source is turned on, and matches the edges of a system clock signal and an internal clock signal within two hundred cycles, thereby matching the output timing to the system clock signal.

Figure 6:
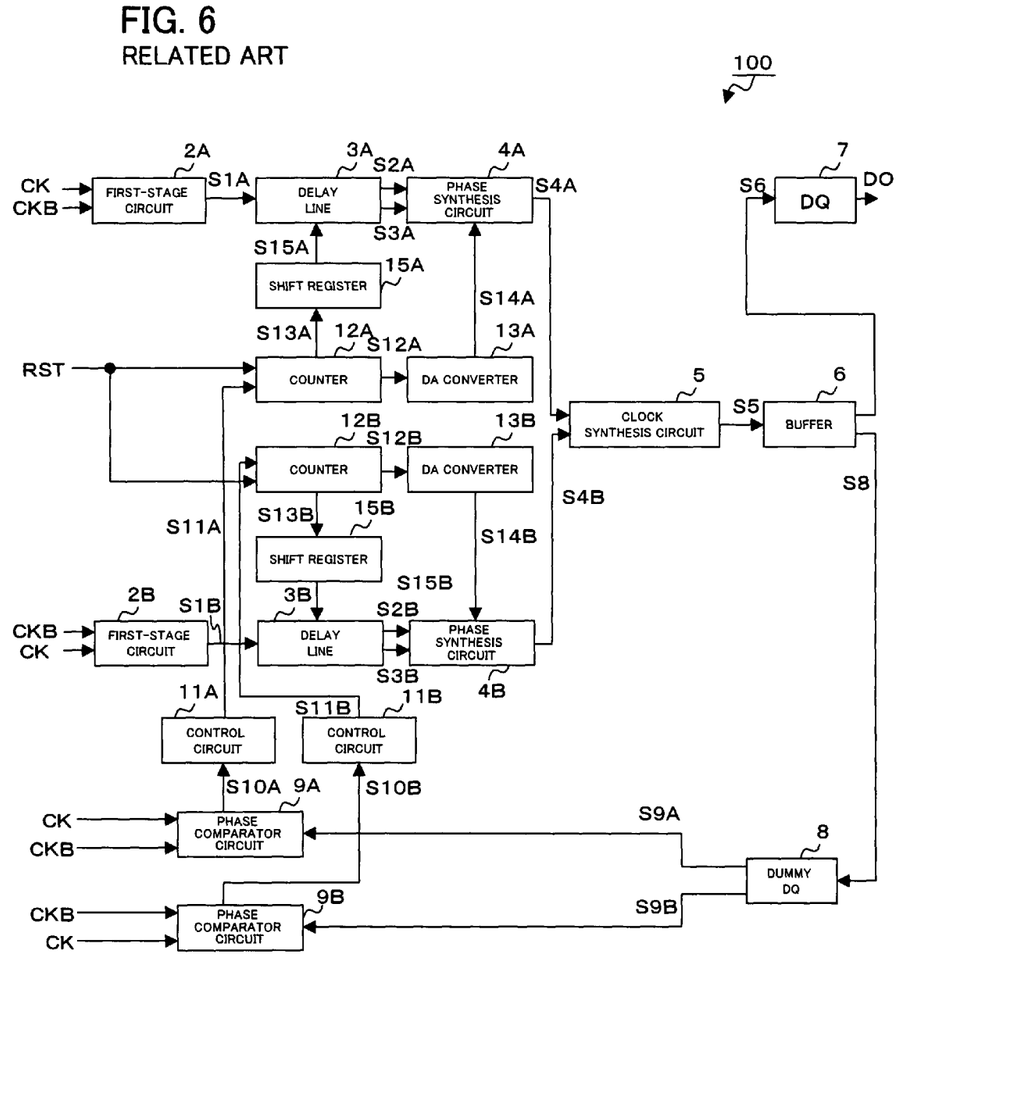
FIG. 6 is a block diagram showing an example of a DLL circuit in the related art.

FIG. 6 is a block diagram showing an example of a related DLL circuit. In FIG. 6, the DLL circuit 100 has a general configuration in which the rising and falling edges of system clock signals CK and CKB are independently and respectively matched to the rising and falling edges of an internal clock signal. The DLL circuit 100 comprises counters 12A and 12B for the rising edge and the falling edge respectively so as to independently and respectively lock up to the rising and falling edges of the system clock signals CK and CKB. The counters 12A and 12B are used to determine the delay amounts of delay lines 3A and 3B respectively. The counters 12A and 12B respectively output the lower bits of their counter values to DA converters 13A and 13B, and output the remaining higher bits to shift registers 15A and 15B respectively. The DA converters 13A and 13B are used to perform fine adjustment of the internal delay time of the DLL circuit 100, and the shift registers 15A and 15B are used to perform coarse adjustment of the internal delay time of the DLL circuit 100. When the duty ratio of the system clock signals CK and CKB is 50%, the counter values of the shift register 15A for the rising edge and the shift register 15B for the falling edge are approximately the same.

When the DLL circuit 100 receives a reset signal RST, the counters 12A and 12B are initialized and the DLL circuit 100 starts a lock-up sequence. On the rising edge side, a first-stage circuit 2A receives the system clock signals CK and CKB, and it outputs a signal S1A to the delay line 3A. The delay line 3A is a delay circuit that performs coarse adjustment, and it outputs signals S2A and S3A having a delay amount determined by the counter value of the shift register 15A for the rising edge to a phase synthesis circuit 4A in the following stage. There is a slight difference in delay length between the signals S2A and S3A. The phase synthesis circuit 4A synthesizes these two signals S2A and S3A at a ratio specified by the DA converter 13A and outputs a signal S4A. In other words, the phase synthesis circuit 4A is used to perform fine adjustment (tuning) of the phase.

Similarly, on the falling edge side, a first-stage circuit 2B receives the system clock signals CK and CKB, and it outputs a signal S1B to the delay line 3B. The delay line 3B outputs signals S2B and S3B having delay amounts determined by the counter value of the shift register 15B for the falling edge to a phase synthesis circuit 4B in the following stage. The phase synthesis circuit 4B synthesizes these two signals S2B and S3B at a ratio specified by the DA converter 13B and outputs a signal S4B.

A clock synthesis circuit 5 synthesizes the signals S4A and S4B. A buffer 6 buffers a signal S5 synthesized by the clock synthesis circuit 5, and outputs it as signals S6 and S8 to DQ7 and a dummy DQ8. DQ7 outputs a signal D0 to the outside, and the dummy DQ8 outputs a signal S9A, which is the same signal as the signal D0, and its inverted signal S9B to phase comparator circuits 9A and 9B respectively.

On the rising edge side of the system clock signal CK, the phase comparator circuit 9A compares the phases of the system clock signal CK and the signal S9A in order to align the phases of the system clock signal CK and the signal S9A outputted from the dummy DQ8, and operates a control circuit 11A so that the counter value of the counter 12A continues to increase (increment) until the rising edge of the system clock signal CK is detected. Because of this, the signal S9A is delayed until it is matched with the system clock signal CK.

Similarly, on the falling edge side, the phase comparator circuit 9B compares the phases of the system clock signal CKB and the signal S9B in order to align the phases of the system clock signal CKB and the signal S9B outputted from the dummy DQ8, and operates a control circuit 11B so that the counter value of the counter 12B continues to increase (increment) until the falling edge of the system clock signal CKB is detected. Because of this, the signal S9B is delayed until it is matched with the system clock signal CKB. Hereinafter, mainly the rising edge side will be described.

Figure 7:
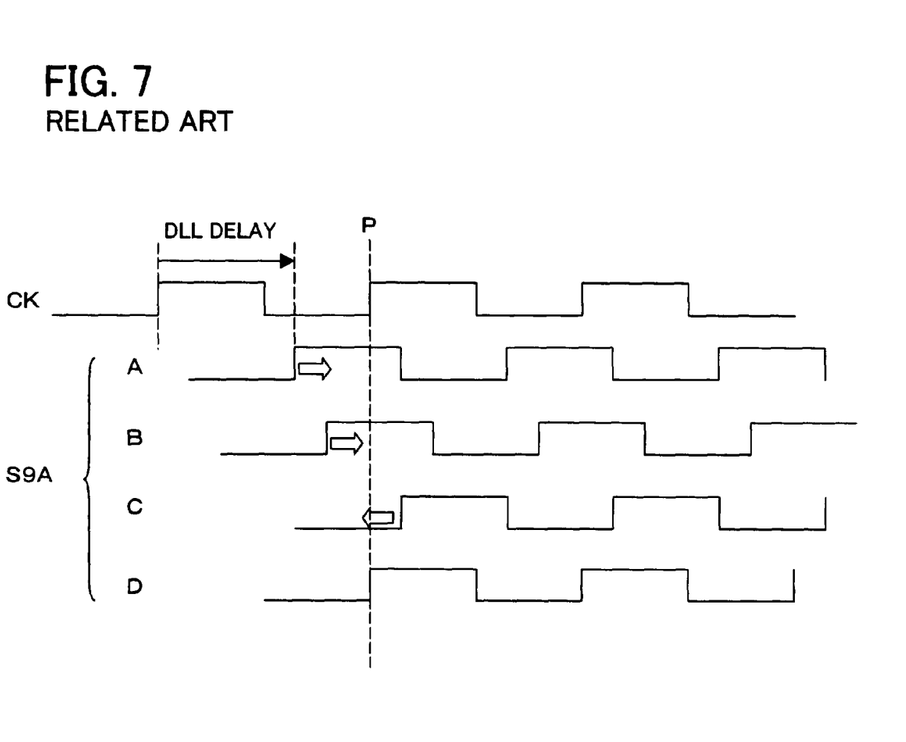
FIG. 7 is a timing chart showing the phase relationship between a system clock signal CK and a signal S9A during normal operation of the related DLL circuit.

FIG. 7 is a timing chart showing the phase relationship between the system clock signal CK and the signal S9A during normal operation of the related DLL circuit shown in FIG. 6. A waveform A in FIG. 7 shows the waveform of the signal S9A, delayed from the system clock signal CK by the amount specific to the DLL circuit, when the counter 12A is initialized with a DLL reset. The DLL circuit 100 increases (increments) the value of the counter 12A so that the rising edge of the signal S9A is aligned with an edge P of the system clock signal CK. The waveform of the signal S9A changes from the waveform A to a waveform B in FIG. 7 when the counter value of the counter circuit 12A is increased (incremented). The rising edge of the waveform B has not yet reached the rising edge P of the system clock signal CK, therefore the counter value is increased (incremented) even more to result in a waveform C. When in the state of the waveform C, since the rising edge P of the system clock signal CK has been detected, the counter value is decreased (decremented) so that the rising edge P of the system clock signal CK is redetected again. Finally, as indicated by a waveform D, the rising edge P of the system clock signal CK is matched with the rising edge of the signal S9A.

At DLL reset, the DLL circuit 100 operates as described above, and matches the edges of the system clock signal CK and the signal S9A, which is an internal clock signal, thereby matching the output timing of the signal S9A to the system clock signal CK. Further, the edges of the system clock signal CKB and the signal S9B, which is another internal clock signal, are matched, thereby matching the output timing of the signal S9B to the system clock signal CKB.

As a related technology, a CPU reset circuit capable of preventing a malfunction at startup is disclosed in Patent Document 1. This CPU reset circuit generates a CPU history signal that determines whether the CPU is operating normally, and resets the CPU with the CPU history signal when the CPU malfunctions.

[Patent Document 1] Japanese Patent Kokai Publication No. JP-A-8-263177.

SUMMARY OF THE DISCLOSURE

The following analyses are presented under the present invention. The entire disclosure of the above mentioned Patent Document 1 is incorporated herein by reference thereto.

The semiconductor integrated circuit device in the related art has several problems. Since the DLL reset is performed during the power-on sequence immediately after the power is turned on, a problem might occur during the lock-up sequence if the DLL reset is performed before the power level has increased sufficiently, which is counted as a first problem.

Further, there is a second problem as follows. That is, malfunction might occur if a large noise caused by the operation of an external circuit occurs in the DLL circuit during the lock-up sequence of the DLL circuit 100, even if the power of the DLL circuit 100 has reached its normal level at DLL reset. More concretely, if the DLL circuit determines that it has detected an edge when a noise has occurred and the voltage of the power of the DLL circuit 100 has dropped due to the noise, the DLL circuit 100 will miss the edge of the system clock signal CK that it is supposed to lock when the noise goes away. The noise-induced malfunction of the DLL circuit 100 rarely occurs when the operating frequency is relatively slow. However, as the operating frequency becomes faster, the possibility of the noise-induced malfunction of the DLL circuit 100 increases due to the fact that the intervals between the edges of the system clock signal gets shorter.

Therefore, it is an object of the present invention to provide a semiconductor integrated circuit device comprising a DLL circuit capable of operating stably against power fluctuation and noise at reset of the DLL circuit.

Figure 8:
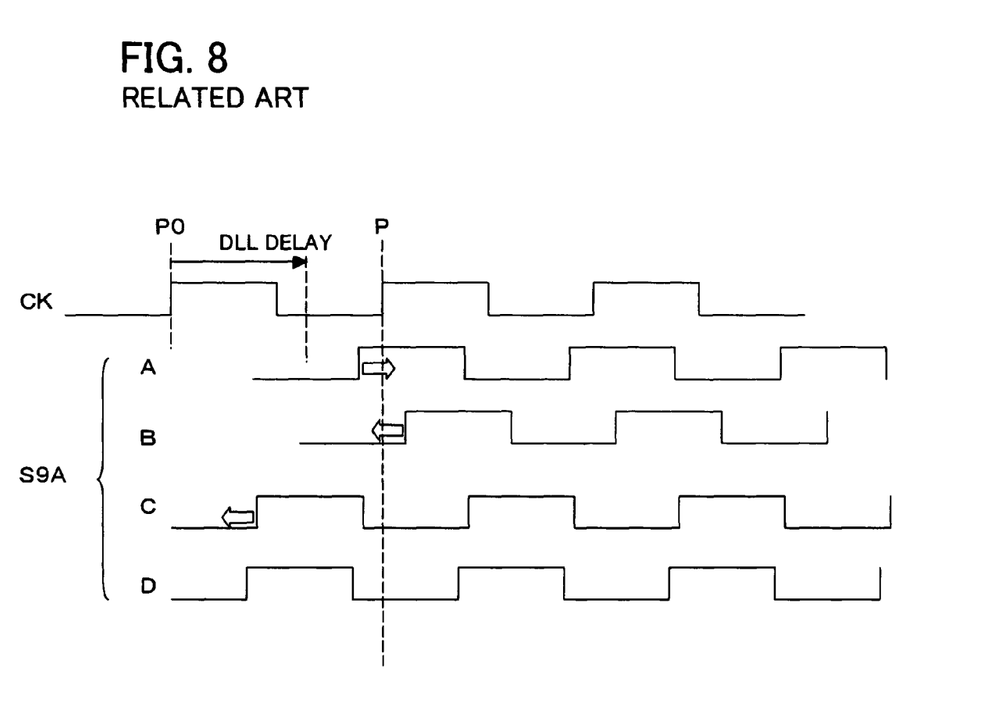
FIG. 8 is a timing chart when the related DLL circuit malfunctions due to an insufficient increase in the power of the DLL circuit after a DLL reset has been performed.

The present inventor analyzed timing charts of the semiconductor integrated circuit device in order to clarify the above-described problems. FIG. 8 is a timing chart when the related DLL circuit shown in FIG. 6 malfunctions due to the insufficient increase in the power of the DLL circuit after the DLL reset has been performed. When the power of the DLL circuit 100 has not increased sufficiently after the DLL reset, the signal S9A is delayed even with the same counter value. A waveform A in FIG. 8 shows the positional relationship between the system clock signal CK and the signal S9A after the DLL reset has been performed. If the power of the DLL circuit 100 reached a sufficient level, the rising edge of the signal S9A would be delayed only by the delay amount specific to the DLL circuit. However, since the power level of the DLL circuit 100 is not sufficient, the signal S9A is delayed even more. The DLL circuit 100 increases the counter value of the counter circuit 12A shown in FIG. 6 aiming that the rising edge of the signal S9A is matched with the edge P of the system clock signal CK. The waveform of the signal S9A changes from the waveform A to a waveform B shown in FIG. 8 after the counter value of the counter circuit 12A has been increased. When in the state of the waveform B, since the rising edge P of the system clock signal CK has been detected, the counter value is decreased aiming that the rising edge P of the system clock signal CK is redetected. As shown by a waveform C, when the power of the DLL circuit 100 reaches a sufficient level, the position of the signal S9A is pushed ahead by the increase amount of the power level of the DLL circuit, even if the counter value is the same as the one at the time of the waveform B. Now, the DLL circuit 100 misjudges as if it is still in the state of the waveform B, and continues to decrease the counter value, thinking that it is getting closer to the edge P of the system clock signal, but in reality it is getting closer to an edge P0. When the counter value reaches its minimum value, unable to any more push ahead the phase of the signal S9A earlier than the position indicated by a waveform D, the DLL circuit stops operating.

As described, due to the fact that the DLL reset is performed during the power-on sequence, when the DLL circuit starts a lock-up sequence without having a desirable power level, the DLL circuit malfunctions and cannot perform the lock-up operation.

Figure 9:
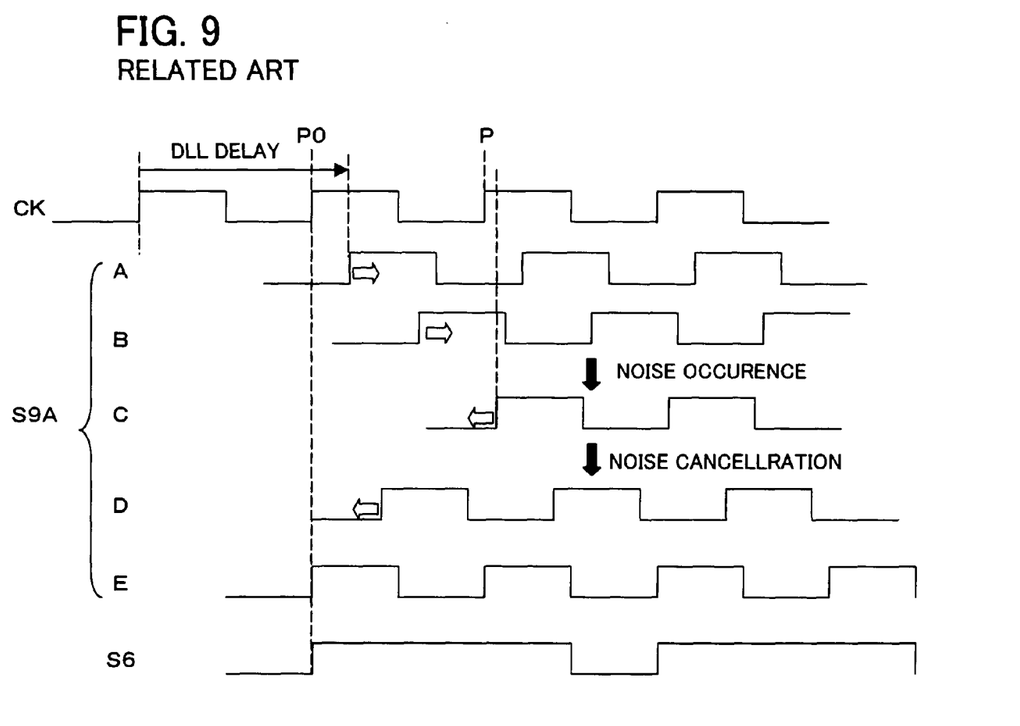
FIG. 9 is a timing chart when the related DLL circuit malfunctions due to noise.

Furthermore, FIG. 9 is a timing chart when the related DLL circuit shown in FIG. 6 malfunctions due to noise. A waveform A shows the phase relationship between the system clock signal CK and the signal S9A immediately after a DLL reset. Since the power of the DLL circuit 100 has reached its normal level at the DLL reset, the rising edge of the signal S9A is delayed only by the delay amount specific to the DLL circuit 100. The DLL circuit 100 increases the value of the counter 12A in FIG. 6 aiming that the rising edge of the signal S9A is matched with the edge P of the system clock signal CK. The waveform of the signal S9A changes from the waveform A to a waveform B in FIG. 9 after the counter value of the counter 12A has been increased. If noise occurs to the DLL circuit in the sate of the waveform B, the phase of the signal S9A will be delayed by a voltage drop caused by the noise, even if the counter value remains the same. The waveform at this time is indicated by a waveform C. Even though the counter value is the same for the both waveforms, the phase of the signal S9A, as indicated by the waveform C, is behind the waveform B because the power of the DLL circuit drops due to the noise. At this time, if the rising edge of the signal S9A detects the edge P, as shown by the waveform C, the DLL circuit 100 decreases the counter value and tries to detect the rising edge P of the system clock signal CK. Then, when the noise goes away and the power of the DLL circuit recovers the normal level, the phase of the signal S9A shifts ahead (a waveform D in FIG. 9). When the position of signal S9A coincides with a HIGH period of the system clock signal CK, as is the case with the waveform D, the DLL circuit 100 mistakes the edge P0 as the edge P and shifts the rising edge of the signal S9A towards the edge P0. As described above, if only the circuit that locks to the rising edge of the system clock signal malfunctions, the waveform of the signal S6 will have a deviated duty ratio, as shown in FIG. 9.

A semiconductor integrated circuit device according to an aspect of the present invention comprises a DLL circuit, a voltage comparator circuit that compares a power supply voltage of the DLL circuit with a reference voltage, and a hold circuit that holds a reset signal until the power supply voltage of the DLL circuit becomes higher than the reference voltage before supplying the reset signal to the DLL circuit when the power supply voltage of the DLL circuit is not higher than the reference voltage upon receiving the reset signal of the DLL circuit.

In a first development of the present invention, the voltage comparator circuit may output a comparison result signal to the hold circuit at a first level when the power supply voltage is not higher than the reference voltage and at a second level when the power supply voltage is higher than the reference voltage; and the hold circuit may output the reset signal to the DLL circuit as it is when the comparison result signal indicates the second level, and holds the reset signal until the comparison result signal indicates the second level before outputting it to the DLL circuit when the comparison result signal indicates the first level.

In a second development of the present invention, the hold circuit may comprise an input terminal that receives the reset signal, an output terminal connected to the DLL circuit, a first switching circuit that connects the input terminal and the output terminal, a latch circuit that latches the reset signal, and a second switching circuit that connects an output end of the latch circuit and the output terminal and that performs a reverse open/close operation to that of the first switching circuit. The first switching circuit may be closed when the comparison result signal indicates the second level and the second switching circuit may be closed when the comparison result signal indicates the first level.

A semiconductor integrated circuit device according to another aspect of the present invention comprises a DLL circuit operating such that a rising edge and a falling edge of an internal clock signal are respectively matched to a rising edge and a falling edge of a system clock signal. The semiconductor integrated circuit device further comprises a clock calculation circuit that counts pulses of the system clock signal after the DLL circuit has been reset, a judging circuit that judges whether or not a difference between counter values of a shift register circuit for the rising edge and a shift register circuit for the falling edge is equal to or more than a predetermined value when the clock calculation circuit has counted a predetermined number of pulses, and a DLL re-reset circuit that re-issues a reset of the DLL circuit when the difference between the counter values is equal to or more than a predetermined value.

In a third development of the present invention, the judging circuit may judge whether or not values of predetermined bit positions in the counter values of the shift register circuit for the rising edge and the shift register circuit for the falling edge coincide with each other.

In a further development of the present invention, a PLL circuit may replace the DLL circuit.

The meritorious effects of the present invention are summarized as follows.

According to the present invention, by holding or re-issuing a DLL reset signal, a DLL circuit performs a lock-up operation reliably and the operation at reset becomes more stable against power fluctuation and noise.

PREFERRED MODES OF THE INVENTION

First Example

Figure 1:
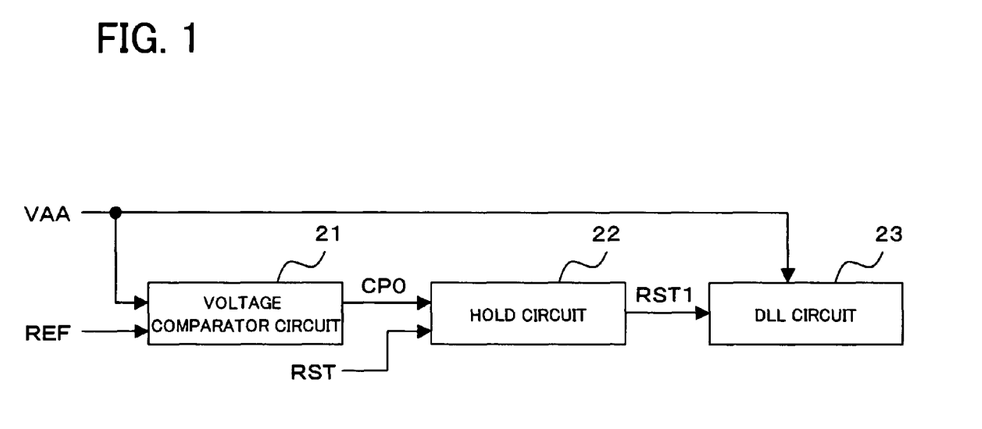
FIG. 1 is a block diagram showing the configuration of a semiconductor integrated circuit device relating to a first example of the present invention.

FIG. 1 is a block diagram showing the configuration of a semiconductor integrated circuit device relating to a first example of the present invention. In FIG. 1, the semiconductor integrated circuit device comprises a potential comparator circuit 21, a hold circuit 22, and a DLL circuit 23. The potential comparator circuit 21 receives a power supply potential VAA for delay locked loop and a reference potential REF for comparison, and outputs a signal CPO, e.g., at HIGH level to the hold circuit 22 when the level of VAA is higher than that of REF. The hold circuit 22 receives the signal CPO, which is the result of comparison by the potential comparator circuit 21, and a reset signal RST, and if the signal CPO is at LOW level when the reset signal RST is received, the hold circuit 22 extends the width of the reset signal RST until the signal CPO becomes HIGH level, and outputs the extended reset signal (an extended DLL reset signal) RST1 to the DLL circuit 23.

Figure 2:
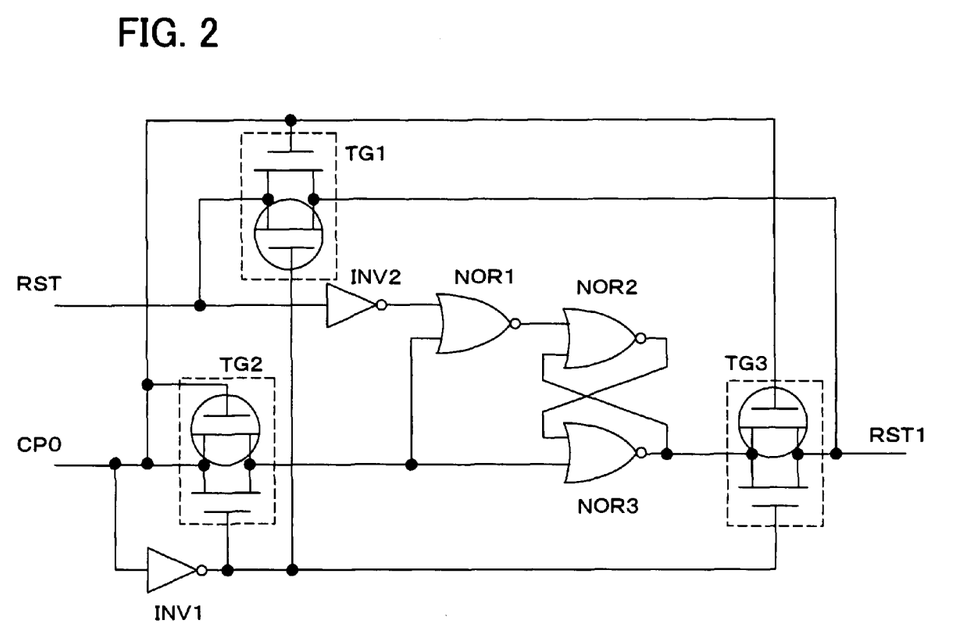
FIG. 2 is a circuit diagram showing an example of a hold circuit.

FIG. 2 is a circuit diagram showing an example of the hold circuit 22. When the signal CPO, the comparison result by the potential comparator circuit 21, is at HIGH level, i.e., when the power supply potential VAA remains at its normal level, a transfer gate TG1, driven by the signal CPO, is short-circuited (tuned conductive: ON), and transfer gates TG2 and TG3, driven by a signal obtained by inverting the signal CPO with an inverter circuit INV1, are opened. In other words, the reset signal RST is outputted as the reset signal RST1 without being modified. On the other hand, when the power supply potential VAA does not reach the reference value and the signal CPO is at LOW level, the transfer gate TG1 is opened and the transfer gates TG2 and TG3 are short-circuited. In other words, an output of an RS flip-flop constituted by NOR circuits NOR1, NOR2 and NOR3 and reset by the reset signal RST is outputted as the reset signal RST1.

Figure 3:
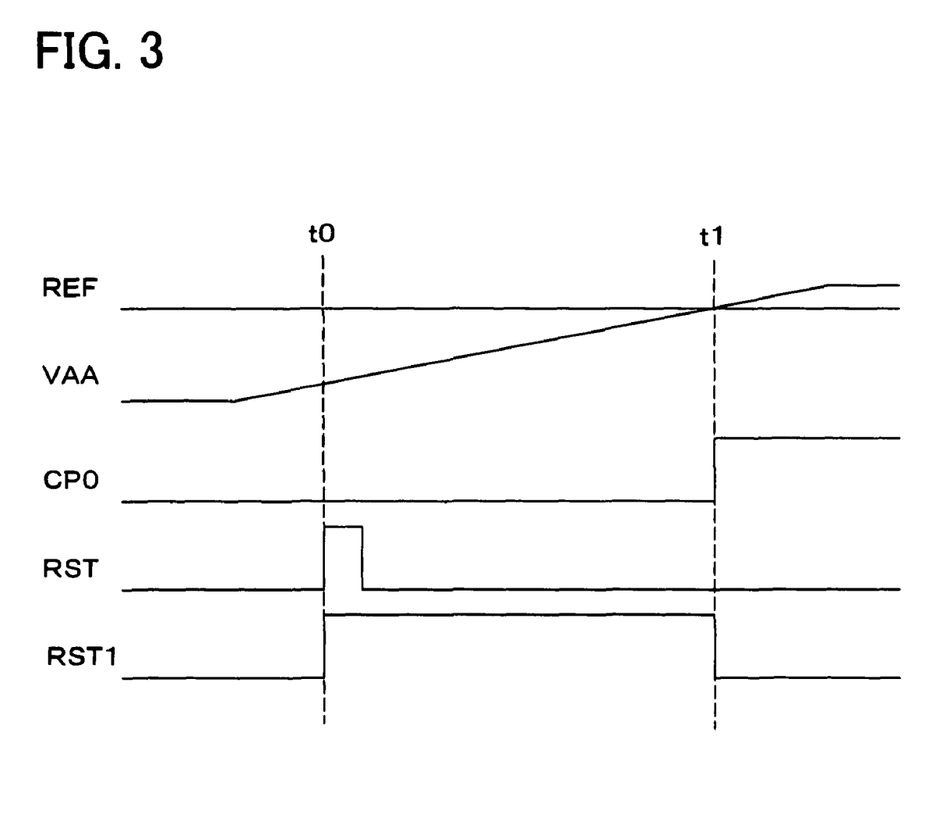
FIG. 3 is a timing chart when an extended reset signal is outputted.

FIG. 3 is a timing chart when the extended reset signal is outputted. In the case where the signal CPO is at LOW level at time t0 when the reset signal RST is received, i.e., the power supply potential VAA is lower than the reference potential REF, the reset signal RST1 is generated and the reset signal RST1 is kept at HIGH level until time t1 when the power supply potential VAA is equal to or higher than the reference potential REF.

When the reset signal RST is received with the power supply potential VAA for delay locked loop lower than the reference value, the semiconductor integrated circuit device configured as described above holds the width of the reset signal RST as the reset signal RST1 until the power supply potential of the DLL circuit 23 reaches the reference value. Because of this, the DLL reset, which is performed when the power is turned on, is executed with an appropriate circuit state, and the DLL circuit 23 is initialized while in a stable internal state. As a result, the lock-up sequence can be performed more reliably and the operation at reset becomes more stable against power fluctuation and noise.

Second Example

Figure 4:
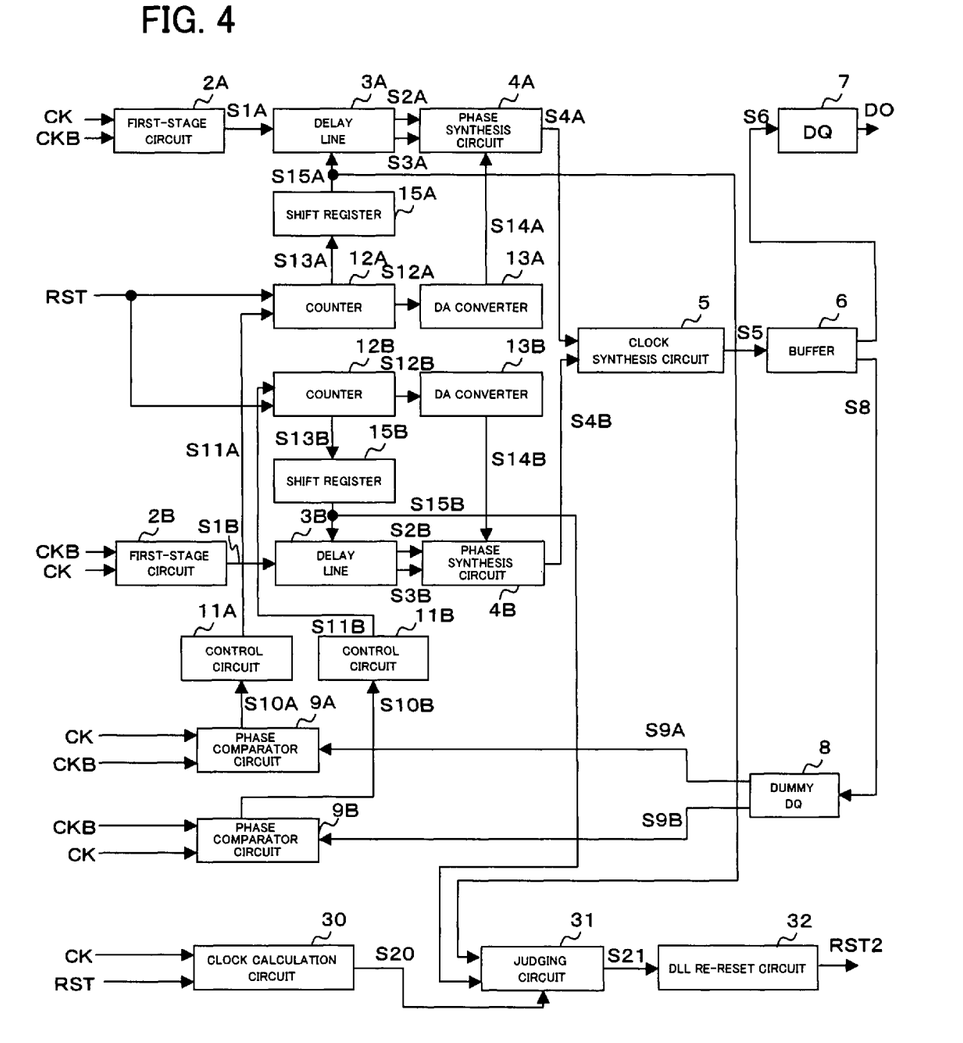
FIG. 4 is a block diagram showing the configuration of a semiconductor integrated circuit device relating to a second example of the present invention.

FIG. 4 is a block diagram showing the configuration of a semiconductor integrated circuit device relating to a second example of the present invention. In FIG. 4, the symbols same as the ones in FIG. 6 indicate the same things, thus the explanations of them will be omitted. The semiconductor integrated circuit device shown in FIG. 4 further comprises a clock calculation circuit 30, a judging circuit 31 and a DLL re-reset circuit 32, in addition to the DLL circuit 100 in FIG. 6. The clock calculation circuit 30 receives the system clock signal CK and the reset signal RST, counts the clock pulses of the system clock signal CK after the reset signal RST has been received, and outputs a signal S20 after a predetermined number, e.g., two hundred cycles, has been counted. The judging circuit 31 receives the signal S20 and each counter value of the two shift registers 15A and 15B in the DLL circuit, and outputs a signal S21 as a judgment result to the DLL re-reset circuit 32. In other words, when there is a difference larger than a predetermined value between the counter values of the shift registers 15A and 15B, the judging circuit 31 has the DLL re-reset circuit 32 perform a reset again. Upon receiving the signal S21, the DLL re-reset circuit 32 outputs a signal RST2 that re-resets the DLL circuit. The RST2 is received by the counters 12A and 12B as a reset signal RST that performs a re-reset operation.

In the configuration described above, if the edge of the system clock signal that is supposed to be locked is not locked on only the rising edge side or the falling edge side due to a malfunction of the DLL circuit, there will be a difference between each data held by the shift register 15A and the shift register 15B. Taking DDR2-DRAM as an example, the DLL circuit must complete the lock-up operation within two hundred cycles. Therefore, the judging circuit 31 starts to compare the counter values of the shift register 15A and shift register 15B two hundred cycles after the reset of the DLL circuit, and when the difference between the two values are not smaller than the reference value, the signal S21 requesting a re-reset of the DLL circuit is outputted to the DLL re-reset circuit 32. As described, when the DLL circuit mistakenly locks to an edge different from the desired edge of the system clock signal, it is possible to redo the lock-up sequence.

Figure 5:
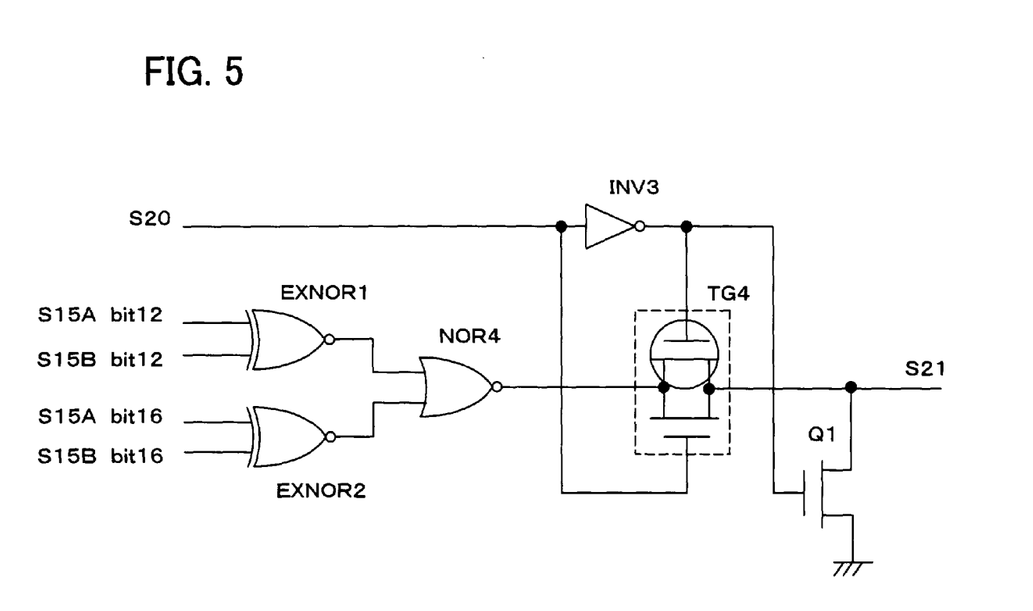
FIG. 5 is a circuit diagram showing a concrete example of a judging circuit.

FIG. 5 is a circuit diagram showing a concrete example of the judging circuit 31. When the judging circuit 31 compares the counter values of the shift registers 15A and 15B, it does not compare all the bits, but it judges whether or not reference bits coincide by performing exclusive OR operation as indicated in FIG. 5. In the example shown in FIG. 5, when there is a difference of four or more bits between the shift registers for the rising edge and the falling edge, it is judged that there is a mistake in the lock-up operation and a HIGH level signal is outputted to the DLL re-reset circuit 32 in the next stage. In other words, bits 12 and bits 16 of the shift register circuits 15A and 15B are respectively compared with each other by exclusive-NOR circuits EXNOR1 and EXNOR2, and when one of the bit pairs coincides with each other in an NOR circuit NOR4, it is determined that the lock-up operation has been performed correctly. Only when neither pair coincides with each other in the NOR circuit NOR4, the signal S21 is outputted to the DLL re-reset circuit 32 via a transfer gate TG4, turned on by the signal S20, in order to request a re-reset.

According to the circuit as configured above, since the DLL reset, performed immediately after the power is turned on and when the circuit is relatively unstable internally, is extended until the power of the DLL circuit is reliably stable, the delay time of the internal clock signal becomes stable after the lock-up sequence has started, and the phase comparison with the system clock signal can be performed accurately, eliminating the possibility of malfunction at the time of the phase judgment.

Note that performing the above-described processing means that the lock-up operation cannot be completed within two hundred cycles when the DLL re-reset has to be executed, however, there is a benefit of being able to operate normally with an originally faulty sample. Further, considering the fact that, in practical use, a READ command is not received at least approximately 1 ms (260,000 cycles at an operating frequency of 533 MHz) after the power-on sequence, the benefit of the present invention is significant.

Further, although the descriptions are made regarding the DLL circuit in the first and second examples, these examples can be similarly applied with a PLL circuit replacing the DLL circuit.

The present invention is applicable to a semiconductor device such as a DRAM memory comprising a DLL circuit that synchronizes the input/output timing to a system clock signal during high-speed operation.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit device comprising:
   a DLL circuit that receives an external clock from an input terminal thereof and produces an internal clock at an output terminal thereof in synchronism with the external clock, the DLL circuit operating on a power supply voltage applied thereto;
   a voltage comparator circuit configured to compare a first voltage related to the power supply voltage with a reference voltage, the voltage comparator circuit producing a comparison result signal that takes a first logic level when the first voltage is smaller than the reference voltage, and a second logic level when the first voltage is equal to or larger than the reference voltage;
   a reset node supplied with a reset signal; and
   a hold circuit coupled to the voltage comparator circuit and the reset node to receive the comparison result signal and the reset signal, the hold circuit resetting the DLL circuit in response to the reset signal to bring the DLL circuit from an active state to an initial state and releasing the DLL circuit in response to the second logic level of the comparison signal to bring the DLL circuit from the initial state to the active state.

2. The semiconductor integrated circuit device as defined in claim 1 wherein said hold circuit comprises:
   an input terminal configured to receive said reset signal;
   an output terminal connected to said DLL circuit;
   a first switching circuit configured to connect said input terminal and said output terminal;
   a latch circuit configured to latch said reset signal; and
   a second switching circuit configured to connect an output end of said latch circuit and said output terminal and configured to perform a reverse open/close operation to that of said first switching circuit;
   wherein said first switching circuit is configured to be closed when said comparison result signal indicates said second logic level, and said second switching circuit is configured to be closed when said comparison result signal indicates said first logic level.

3. The semiconductor integrated circuit device as defined in claim 1 wherein a PLL circuit replaces said DLL circuit.

4. A semiconductor integrated circuit device comprising:
   a DLL circuit that receives an external clock from an input terminal thereof and produces an internal clock at an output terminal thereof in synchronism with the external clock, the DLL circuit operating on a power supply voltage applied thereto;

voltage comparison means for comparing a first voltage related to the power supply voltage with a reference voltage, the voltage comparison means producing a comparison result signal that takes a first logic level when the first voltage is smaller than the reference voltage, and a second logic level when the first voltage is equal to or larger than the reference voltage;

a reset node supplied with a reset signal; and a holding means coupled to the voltage comparison means and the reset node to receive the comparison result signal and the reset signal, the holding means for resetting the DLL circuit in response to the reset signal to bring the DLL circuit from an active state to an initial state and releasing the DLL circuit in response to the second logic level of the comparison signal to bring the DLL circuit from the initial state to the active state.

5. The semiconductor integrated circuit device as defined in claim 4 wherein said holding means comprises:

an input means for receiving said reset signal;

an output means connected to said DLL circuit;

a first switching means for connecting said input means and said output means;

a latching means for latching said reset signal; and a second switching circuit means for connecting an output end of said latching means and said output means and for performing a reverse open/close operation to that of said first switching means;

wherein said first switching means is further for being closed when said comparison result signal indicates said second logic level, and said second switching means is closed when said comparison result signal indicates said first logic level.

6. The semiconductor integrated circuit device as defined in claim 4 wherein a PLL circuit replaces said DLL circuit.

7. A method for operating a semiconductor integrated circuit device comprising a DLL circuit and a hold circuit, the method comprising:

receiving an external clock from an input terminal of the DLL circuit;

producing an internal clock at an output terminal of the DLL circuit in synchronism with the external clock, the DLL circuit operating on a power supply voltage applied thereto;

comparing a first voltage related to the power supply voltage with a reference voltage to produce a comparison result signal that takes a first logic level when the first voltage is smaller than the reference voltage, and a second logic level when the first voltage is equal to or larger than the reference voltage;

supplying a reset node with a reset signal;

resetting, in response to the reset signal from the reset node, the DLL circuit to bring the DLL circuit from an active state to an initial state; and releasing the DLL circuit in response to the second logic level of the comparison signal to bring the DLL circuit from the initial state to the active state.

\* \* \* \* \*